(12) United States Patent
Deng et al.

(10) Patent No.: US 6,795,327 B2
(45) Date of Patent: Sep. 21, 2004

(54) SEMICONDUCTOR STORAGE METHOD AND DEVICE SUPPORTING MULTI-INTERFACE

(75) Inventors: Guoshun Deng, Shenzhen (CN); Xiaohua Cheng, Beijing (CN); Feng Xiang, Shenzhen (CN)

(73) Assignee: NETAC Technology Co., Ltd., Shenzhen (CN)

( * ) Notice: Subject to any disclaimer, the term of this patent is extended or adjusted under 35 U.S.C. 154(b) by 0 days.

(21) Appl. No.: 10/261,001

(22) Filed: Sep. 30, 2002

(65) Prior Publication Data

US 2003/0099147 A1 May 29, 2003

(30) Foreign Application Priority Data

Nov. 23, 2001 (CN) ........................................ 01258240 U
Feb. 9, 2002 (CN) ........................................ 02114882 A

(51) Int. Cl.[7] ................................................ G11C 5/06
(52) U.S. Cl. ...................... 365/63; 365/51; 365/230.03
(58) Field of Search ........................ 365/63, 51, 230.03

(56) References Cited

U.S. PATENT DOCUMENTS 5,357,473 A * 10/1994 Mizuno et al. ............. 365/201
6,535,414 B2 * 3/2003 Suzuki et al. ................ 365/63

* cited by examiner

Primary Examiner—Son T. Dinh
(74) Attorney, Agent, or Firm—Workman Nydegger

(57) ABSTRACT

A semiconductor storage method and device supporting multi-interface includes the acts of setting up a semiconductor storage device in which is installed a semiconductor storage medium module, a controller module, and an interface module which supports at least two interfaces of different standards, wherein the interfaces include serial or parallel or wireless communication interfaces; connecting the storage device, through the interfaces of different standards, to at least one data processing system which has the corresponding standard interface; establishing information exchange channel between the storage device and the data processing system based upon the serial or parallel or wireless communication interfaces; the storage device exchanges data with the data processing system through the information exchange channel. The method is to provide convenient mobile storage devices for data processing systems that have different interfaces, and to make data and files exchange easily and conveniently among different data processing systems.

22 Claims, 18 Drawing Sheets

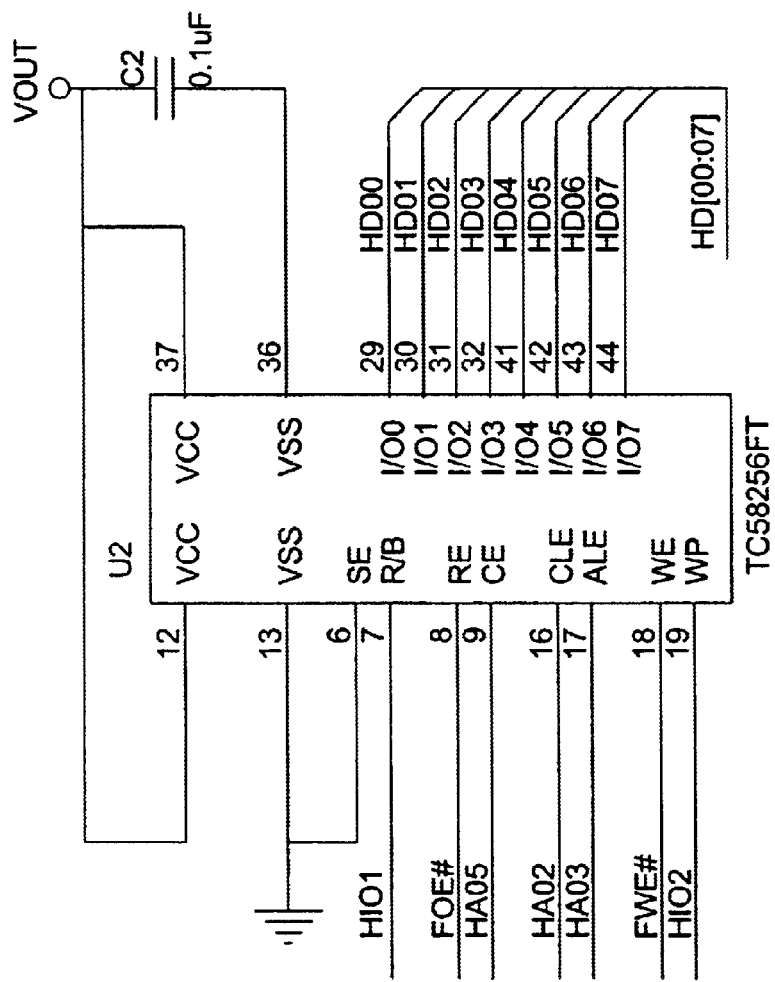
Fig.9B
Fig.10

SEMICONDUCTOR STORAGE METHOD AND DEVICE SUPPORTING MULTI-INTERFACE

FIELD OF INVENTION

The present invention relates to a storage technology of data information, in particular, to a storage method and device having two or more than two interfaces of different standards.

TECHNICAL BACKGROUND

With the development of semiconductor storage technology, semiconductor storage devices have become the favorite of users because of the large capacity, high speed, lightness, and quakeproof properties. With the prosperous development of electronic technologies, electronic digital devices of various kinds are being used, such as digital cameras, palmtop computers, hand-held computers, laptop computers, desktop computers, mobile phones, digital camcorders, and MP3 music players, most of which use semiconductor storage device to store data information. And different digital products need to exchange data files between them. Generally, these digital products adopt various kinds of interface standards; however, conventional semiconductor storage devices usually adopt interfaces one standard, which makes it available only on digital products supporting interfaces of the same standard. Despite this, exchange of data files occurred between the digital products and in order to use the storage devices on digital products supporting interfaces of other standards, adapters and reader-writers are needed with functions of transfer. As a result, this increases the burden for the users and brings them of a lot of inconvenience.

A storage device CF card based upon the Flash Memory technology are being more and more widely used on portable electronic devices such as digital cameras, palmtop computers, and hand-held computers and have become a mainstream product in the field of mobile storage products thanks to its large capacity, high speed of writing, low consumption and other desirable properties. It supports hot dock/undock, is mobile, and can store large volumes of files and data; different electronic devices can exchange data and files by means of CF card as well. However, because CF cards have only interfaces of the same standard, they are still not very convenient for use. When they are used on laptop computers, special CF card adapters are needed (such as PCMCIA CF Card adapter). When they are used on desktop computers, special CF card reader-writers are needed (such as USB CF card reader-writer). Therefore, the user cannot directly save the files or data on the CF card into the computer or copy the files or data in the computer to the CF card. When the user uses portable electronic devices outdoors, he must bring with him the special adapters or reader-writers, which increases extra burden and costs. If the reader-writer is lost or damaged, the user will not be able to transfer the contents on the CF card to the host computer or download contents from the host computer to the CF card, and this naturally brings a lot of the inconvenience.

SUMMARY OF THE INVENTION

The objective of the present invention is provide a semiconductor storage method and device supporting multi-interface so as to avoid the drawbacks existing in the above mentioned technologies, and thus dispenses with the extra devices, connecting directly with different kinds of data processing system, being read or written, and functioning as the storage device for different kinds of data processing system, thus allowing the exchange of data between different kinds of data processing systems.

The objective of the present invention can be realized by providing a semiconductor storage method supporting multi-interface, which consists of the following steps:

(a) setting up a semiconductor storage device in which is installed a semiconductor storage medium module, a controller module to control the semiconductor storage device, and an interface module which supports at least two interfaces of different standards, wherein interfaces of different standards include serial or parallel or wireless communication interfaces; physically, the modules can exist independently or they can be combined into one or two modules;

(b) connecting the storage device, through the interfaces of different standards, to at least one data processing system which has the corresponding standard interface;

(c) establishing information exchange channel between the storage device and the data processing system based upon the serial or parallel or wireless communication interfaces;

(d) the storage device exchanges data through the exchange channel with the data processing system and stores data from the data processing system into the semiconductor storage medium module (10); the data processing system can retrieve required data from the semiconductor storage device.

The objective of the present invention can be further realized by providing a semiconductor storage device supporting interfaces of different standards that can be used in a data processing system, which comprises a semiconductor storage medium module for storing data, a controller module, and an interface module which supports at least two interfaces of different standards, wherein the interfaces of different standards include serial or parallel or wireless communication interfaces; the controller module is connected with the semiconductor storage medium module and the interface module, thereby coordinating the operation of the different modules.

Compared with the conventional technology, the present invention, having interfaces of more than two different standards, has the following advantages: It provides a convenient mobile storage device for the data processing systems using different interfaces, enabling the simple and easy exchange of data and files between different kinds of data processing system, thus reducing the configuration costs.

The data processing system mentioned in the present invention refers to electronic systems or gadgets with processors, including but not limited to the digital cameras, palmtop computers, hand-held computers, laptop computers, desktop computers, personal computers, microcomputers, data processing workstations, mobile phones, digital camcorders, MP3 music players, as well as various kinds of semiconductor storage device.

DESCRIPTION OF THE DRAWINGS

FIG. 6-1 shows the outer appearance of the semiconductor storage device with the CF interface and the USB interface; FIG. 6-2 shows the outer appearance of the semiconductor storage device with the CF interface and the IEEE 1394 interface; FIGS. 6-3 and 6-4 show the outer appearance of the semiconductor storage device with the CF interface, the IEEE 1394 interface, and the USB interface.

FIG. 10 is a diagram showing the LED indicator circuit of the write-protect switch and working status indicating module 61 in the first embodiment according to the invention;

DETAILED DESCRIPTION OF THE INVENTION

Figure 1:
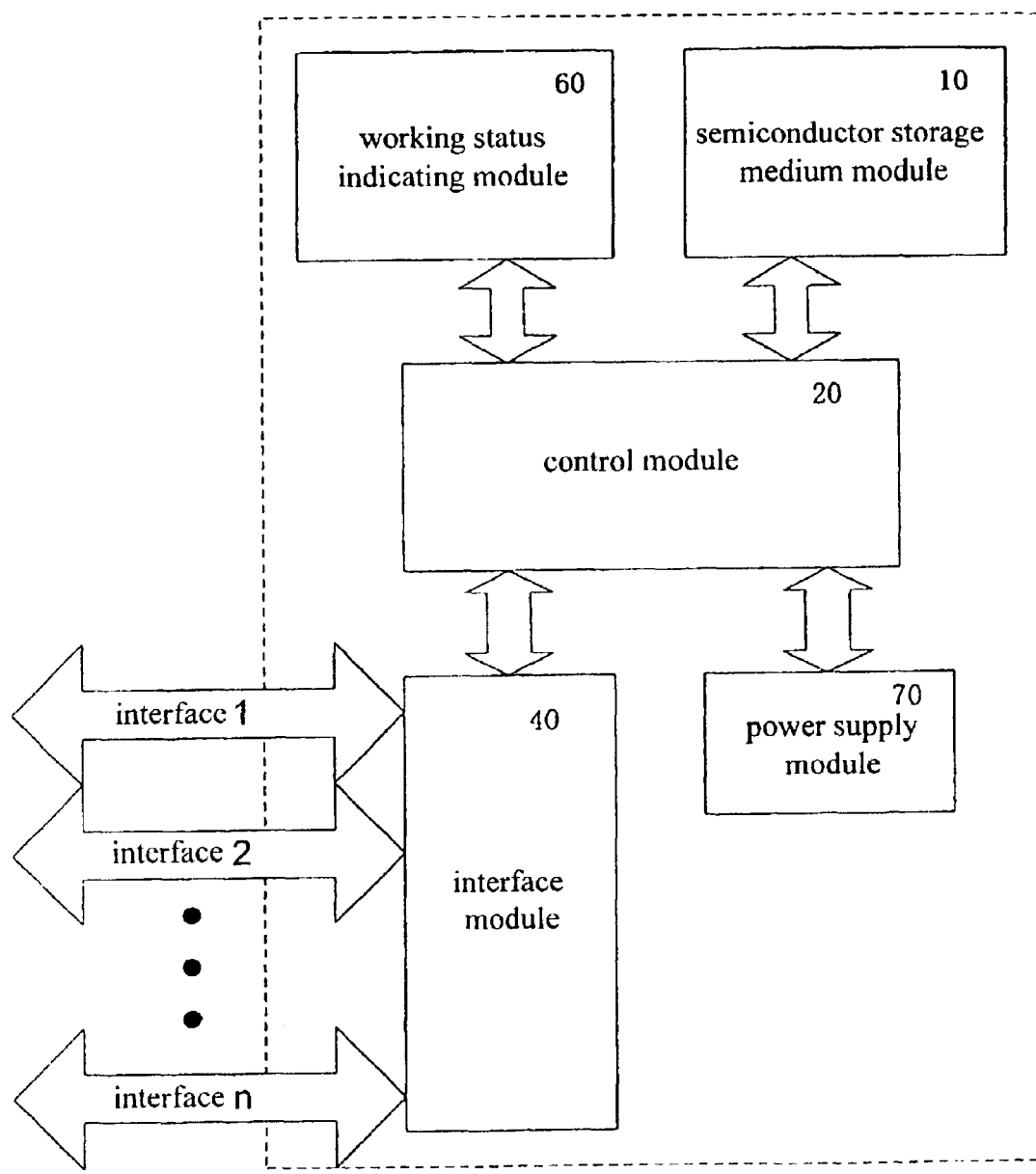
FIG. 1 is a block diagram of the general functions of the method according to the present invention.

As shown in FIG. 1, a semiconductor storage method supporting multi-interface, consisting of the following steps:

(a) setting up a semiconductor storage device in which is installed a semiconductor storage medium module, a controller module to control the semiconductor storage device, and an interface module which supports at least two interfaces of different standards, wherein interfaces of different standards include serial or parallel or wireless communication interfaces; physically, the modules can exist independently or they can be combined into one or two modules;

(b) connecting the storage device, through the interfaces of different standards, to at least one data processing system which has the corresponding standard interface;

(c) establishing information exchange channel between the storage device and the data processing system based upon the serial or parallel or wireless communication interfaces;

(d) the storage device exchanges data through the exchange channel with the data processing system and stores data from the data processing system into the semiconductor storage medium module (10); the data processing system can retrieve required data from the semiconductor storage device.

The interfaces of different standards are physically located at different place of the semiconductor storage device. The serial or parallel or wireless communication interfaces can be CF (Compact Flash), USB (Universal Serial Bus), IEEE 1394, PCMCIA, True IDE, Bluetooth interfaces or wireless LAN interface. The semiconductor storage medium module uses such semiconductor storage media as Flash Memory, DRAM, EEPROM, FRAM, or MRAM. The working power supply of the semiconductor storage device is induced by way of the serial or parallel interfaces, but in the case when the wireless communication interface is used, the semiconductor storage device works on its own power supply or on external power supply. The semiconductor storage device owns the function of indication of working status, which is realized through the indicator component on the working status indicating module 60, the indicator components can be LED, LCD, vibrating mechanism or alarm mechanism. The present invention also owns the write protect function which can prevent data from being written into the storage medium module 10. When the semiconductor storage device is disconnected from the data processing system, the stored data is retained in the semiconductor storage device. There is a power supply module 70 installed in the semiconductor storage device which function includes but not limited to selecting power supply source for the semiconductor storage device, to allow the semiconductor storage device to acquire power with through one of the at least two interfaces of different standards, and at the same time to isolate power supply from the other interfaces.

A semiconductor storage device supporting interfaces of different standards that can be used in a data processing system, which, as shown in FIG. 1, consists of a semiconductor storage medium module 10 that can store data, a controller module 20 and an interface module 40 that can support at least two interfaces of different standards, wherein the at least two interfaces of different standards include serial, parallel or wireless communication interfaces, physically located at different place of the semiconductor storage device, and the controller module 20 is connected to the semiconductor storage medium module 10 and the interface module 40, thus coordinating the performance of the different modules.

The controller module 20 can either be a single module or consist of a plurality of sub controller modules, in which the controller modules control the different interfaces of the interface module 40 respectively, the different sub modules work in coordination through relevant interface protocols.

The serial, parallel or wireless communication interfaces can be CF (Compact Flash), USB (Universal Serial Bus), IEEE 1394, PCMCIA, True IDE, Bluetooth or wireless LAN interfaces, including IEEE 802.11a, IEEE 802.11b, IEEE 802.11 g. The semiconductor storage medium of the semiconductor storage medium module 10 can be a Flash Memory, DRAM, EEPROM, SRAM, SDRAM, FRAM, or MRAM. The working power supply of the semiconductor storage device is provided through the serial or parallel interfaces; however, in the case Bluetooth or wireless communication interfaces are used, the wireless data communication device is self-powered or is externally powered.

The present invention also includes a working status indicating module 60 to indicate the working status of the semiconductor storage device via at least one indicator in the working status indicating module 60. The indicating mechanism can be a LED, LCD, a vibrator or an alarm mechanism. The device also owns the write protect function used to prevent the date that from being written into the storage medium module 10. The working power supply of the semiconductor storage device is provided through the serial or parallel interfaces; however, in the case wireless communication interface is used, the semiconductor storage device is self-powered or is externally powered. There is a power supply protection circuit whose function is to enable the semiconductor storage device to select one of the sources as its power supply, to allow the semiconductor storage device to acquire power with through one of the at least two interfaces of different standards, and at the same time to isolate power supply from the other interfaces.

FIG. 1 is a block diagram showing the function of the present invention. A semiconductor storage device supporting multi-interface includes a semiconductor storage medium module 10, a controller module 20, a working status indicating module 60 and write protect switch, a power supply module 70, and an interface 1, an interface 2, ..., and an interface n which are adapted to different standards. The controller module 20 is connected to the semiconductor storage medium module 10, the working status indicating module 60 and the write protect switch, and the power supply module 70 respectively; In the operating state, the semiconductor storage device supporting multi-interface is connected to the electronic devices with corresponding interfaces respectively through at least one of the interfaces 1, 2, ... n. These connections all support bilateral flow of data and signals.

The storage device that supporting multi-interface according to the present invention permits the semiconductor storage device supporting multi-interface to be connected to data processing systems having corresponding interfaces via the interfaces of different standards (such as a palmtop computer, a digital camera, a MP3 player, and so forth) in order to transfer and store data and information and to make them to be used as external storage devices from which data are immediately accessible.

The data processing system mentioned herein is also called the host computer or host system, including but not limited to various kinds of personal computer, microcomputer, data processing work station, palmtop, digital camera, laptop, desktop, mobile phone, MP3 player and special data processing system and storage device. The semiconductor storage medium module 10 includes one or more semiconductor storage medium chip, the semiconductor storage medium can be, but is not limited to a Flash Memory, DRAM, EEPROM, SRAM, SDRAM, FRAM, or MRAM, connected in accordance with the present addressing method. The function of the module is to save data. The function of the semiconductor storage medium module 10 is save the data needed to be stored received from the data processing system by the storage controller module 20, and the data saved on the module can also be read. The data stored on the module can be drivers of the present invention or data files of different types.

The controller module 20 completes the initialization and control of the semiconductor storage device, receives commands and data from external data processing systems through the interface module 40, these commands including, but not limited to, device inquiry command, data read command, data write command, device status inquiry command, and so on, interprets and executes the commands received, stores data to or reads data from the semiconductor storage medium module 10, returns the results of execution and the status of the semiconductor storage device to the external data processing system through the interface module 40, and controls the operation of the status indicating module 60 and write protect switch and the power supply module 70.

The interface module 40 establishes connections between the semiconductor storage device and the external data processing system based on the conventional technology. It realizes standard protocols of different interfaces, interprets, converts, controls, and transfers the protocols of interfaces 1, 2, ..., n.

Interfaces 1, 2, ... n show that the semiconductor storage device of the present invention can support at least two interfaces of different standards, which can be either serial or parallel or wireless communication interfaces, including but not limited to USB, IEEE 1394, PCMCIA, CF and Bluetooth and wireless LAN interface. These interfaces are electronically standardized bus interfaces based on the standard serial protocol, but their physical sizes are non-standardized.

The status indicating module 60 is connected to the controller module 20, in which the indicating mechanism functions to indicate the read and write status and the connection status of the semiconductor storage device that supports multi-interface. For example, when the indicator light blinks, it indicates a status that data are transferred or read or written. The present invention can be designed to own different functions that indicate the working status of the semiconductor storage device, and these functions can be realized by means of the indicating mechanism on the working status indicating module such as LED, LCD, a vibrating mechanism or an alarm mechanism.

The present invention also owns a mechanic or electronic read-write protect switch, whose function can be set to prohibit or allow writing data. The switch can set the semiconductor storage device in the present invention to write protect status, protect the data and files stored in the storage device and prevent them from being erased, altered, or infected by viruses. The switch can be a single-pole double throw switch or a photosensitive photoelectric switch. At present, mini slide switches are used as the write-protect switch.

The power supply module 70 enables the working power supply of the semiconductor storage device in the present invention to select one of the standard interfaces as its power supply and at the same time to isolate power supply from the other interfaces. The working power supply of the semiconductor storage device supporting multi-interface is provided through the serial or parallel interfaces; however, in the case Bluetooth or wireless communication interfaces are used, the wireless data communication device is self-powered or is externally powered.

Figure 2:
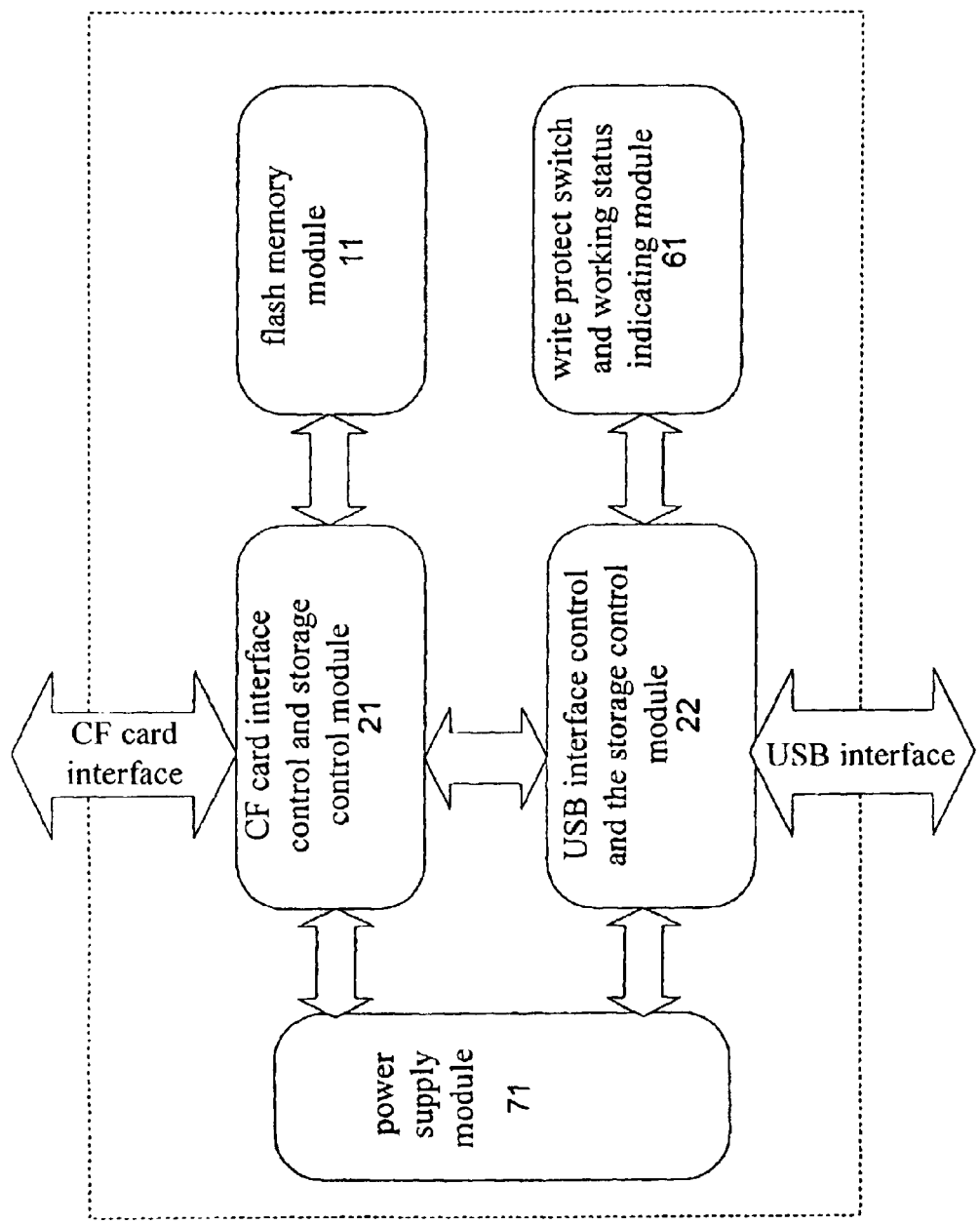
FIG. 2 is a block diagram of the embodiment I according to the present invention using the CF interface and the USB interface.

The first embodiment of the present invention is illustrated in FIG. 2. The semiconductor storage device supports CF interface and USB interface, CF interface compatible with CF-ATA interface or PCMCIA interface or True IDE interface. The semiconductor storage medium adopts the flash memory. As shown in FIG. 2, the semiconductor storage device includes flash memory module 11, CF card interface control and storage control module 21 and USB (Universal Serial Bus) interface control and storage control module 22, CF interface, USB interface, write-protect switch and working status indicating module 61. The CF interface control and storage control module 21 and USB (Universal Serial Bus) interface control and the storage control module 22 implement the functions of the controller module 20 and interface module 40 in FIG. 1. The CF interface control and storage control module 21 is connected to the flash memory module 11, and the USB (Universal Serial Bus) interface control and storage control module 22 is connected to the write-protect switch and working status indicating module 61. The power supply module 71 is connected respectively to the CF interface control and storage control module 21 and USB (Universal Serial Bus) interface control and storage control module 22. When in use, CF-ATA interface or PCMCIA interface or True IDE interface is connected to the data processing system having the corresponding interface, or the USB interface is connected to the host system. All the above connections support bilateral flow of signals and data.

The semiconductor storage device in the present embodiment can be connected to various kinds of electronic device through the CF interface (such as a palmtop, digital camera, MP3 player, and so on) for the purpose of data and information transfer and storage. The CF interface is compatible with CF-ATA interface or PCMCIA interface or True IDE interface. The semiconductor storage device can also be connected to the host computer through the USB interface so as to make data immediately accessible to the host computer as the external storage disk device connected to the host computer. In this case, the semiconductor storage device in the present embodiment can serve as a USB Mass Storage device, which supports the USB Mass Storage protocol recommended by the USB-IF (USB-Implementers Forum), which makes it possible to be recognized by operating systems like Windows Me, Windows 2000, Windows XP, Mac OS9.x/OS X, and Linux 2.4.x, which means that there is no need to install drivers on these systems, thus greatly facilitating the user. If the operating system (such as Windows 98) does not have its own driver for the semiconductor storage device of the present embodiment, a driver program designed for the device has to be installed.

In the present embodiment, the USB interface can be a standard USB interface, such as a standard mini USB interface (Mini USB, On-The-Go standard), or a non-standard USB interface. That is, the USB interface of the present embodiment can conform to the USB standard both in its electric signals and its physical structure and size, or only the electric signals conform to the USB standard while the physical structure and size do not follow the USB standard. The Flash Memory of the Flash Memory module 11 can be one or a plurality of flash memory chips connected in accordance with the present addressing method. The module can store the drivers of the present invention and other types of data files.

In the present embodiment, the semiconductor storage device is connected to the USB interface of the host computer through the USB interface converter or the connection cable that converts the Mini-USB interface to the USB interface.

The USB interface control and storage control sub module 22 completes its connection with the host system, interprets, converts, controls and transmits the USB interface protocol. It completes the initialization and control of the USB interface, receives commands and data from the host computer, interprets and executes the commands, stores the data into the flash memory module 11 or reads data from it through the CF interface and storage control module 21, and returns the results of the execution through the USB interface to the host computer.

The CF interface control and storage control sub module 21 can also complete its connection with other external electronic devices, and interprets, converts, controls and transmits the CF interface protocol; It completes the initialization and control of the CF interface, receives data and commands from external electronic devices, interprets and executes the commands, stores the data to the flash memory module 11 or reads data from it, returns the results of the execution to the data processing system, receives the control commands and data of the USB interface control and storage control sub module 22, and saves the data to be stored to the flash memory module 11 or reads data from it, returns the results of the execution to the USB interface control and storage control sub module 22.

The CF interface control and storage control sub module 21 and the USB interface control and storage control sub module 22 can adopt a single chip or a plurality of chips.

Figure 3:
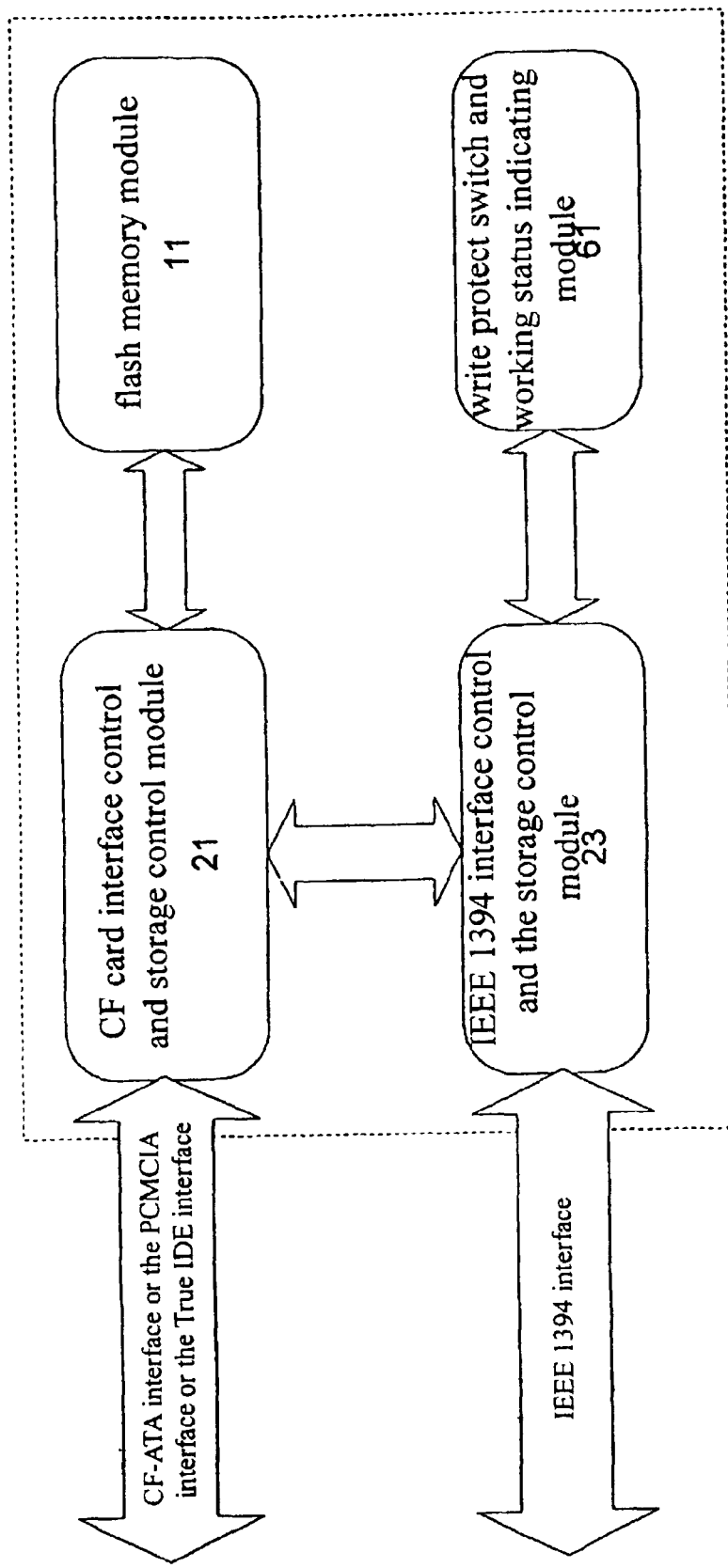
FIG. 3 is a block diagram of the embodiment II according to the present invention using the CF interface and the IEEE1394 interface.

The second embodiment of the present invention, as shown in FIG. 3, the semiconductor storage device supports the CF interface and the IEEE 1394 interface, comprises a flash memory module 11, a CF interface control and storage control module 21 and an IEEE 1394 interface control and storage control module 23, a CF interface, an IEEE 1394 interface, a write-protect switch and working status indicating module 61. The CF interface control and storage control module 21 and the IEEE 1394 interface control and storage control module 23 implement the functions of the controller module 20 and the interface module 40 as shown in FIG. 1. The CF interface control and storage control module 21 is connected with the flash memory module 11, and the IEEE 1394 interface control and storage control module 23 is connected with the write-protect switch and the working status indicating module 61. When in use, the CF-ATA interface or the PCMCIA interface or the True IDE interface is connected with the data processing system having the corresponding interface, or the IEEE 1394 interface is connected with the host system. All the above connections support the bilateral flow of signals and data.

In the present embodiment, the flash memory module 11 includes one or more flash memory chip, connected in accordance with the present addressing method, and the module can store the drivers of the present invention and other types of data files. The IEEE 1394 interface can be the standard IEEE 1394 interface, or the non-standard IEEE 1394 interface. That is, the IEEE 1394 interface 52 in the present embodiment conforms to IEEE 1394 standard in both its electric signals and physical structure and size, or only the electric signals conform to the IEEE 1394 standard while its physical structure and size are of non IEEE 1394 standard.

The IEEE 1394 interface control and storage control module 23 completes its connection with the host system, interprets, converts, controls and transmits the IEEE 1394 interface protocol. It completes the initialization and control of the IEEE 1394 interface, receives commands and data from the host computer, interprets and executes the commands, stores the data into the flash memory module 11 or reads data from it through the CF interface and storage control module 21, and returns the results of the execution through the IEEE 1394 interface to the host computer.

The CF interface control and storage control sub module 21 completes its connection with the data processing system, and interprets, converts, controls and transmits the CF-ATA interface or PCMCIA interface or True IDE interface protocol; It completes the initialization and control of the CF-ATA interface or PCMCIA interface or True IDE interface, receives data and commands from the data processing system, interprets and executes the commands, stores the data to the flash memory module 11 or reads data from it, returns the results of the execution to the data processing system, receives the control commands and data of the IEEE 1394 interface control and storage control sub module 23, and saves the data to be stored to the flash memory module 11 or reads data from it, returns the results of the execution to the IEEE 1394 interface control and storage control sub module 23.

In the present embodiment, the IEEE 1394 interface conforms to IEEE 1394 standard in both its electric signals and physical structure and size, or only the electric signals conform to the IEEE 1394 standard while its physical structure and size are of non IEEE 1394 standard. The CF interface control and storage control sub module 21 and the IEEE 1394 interface control and storage control sub module 23 can adopt a single chip or a plurality of chips.

Figure 4:
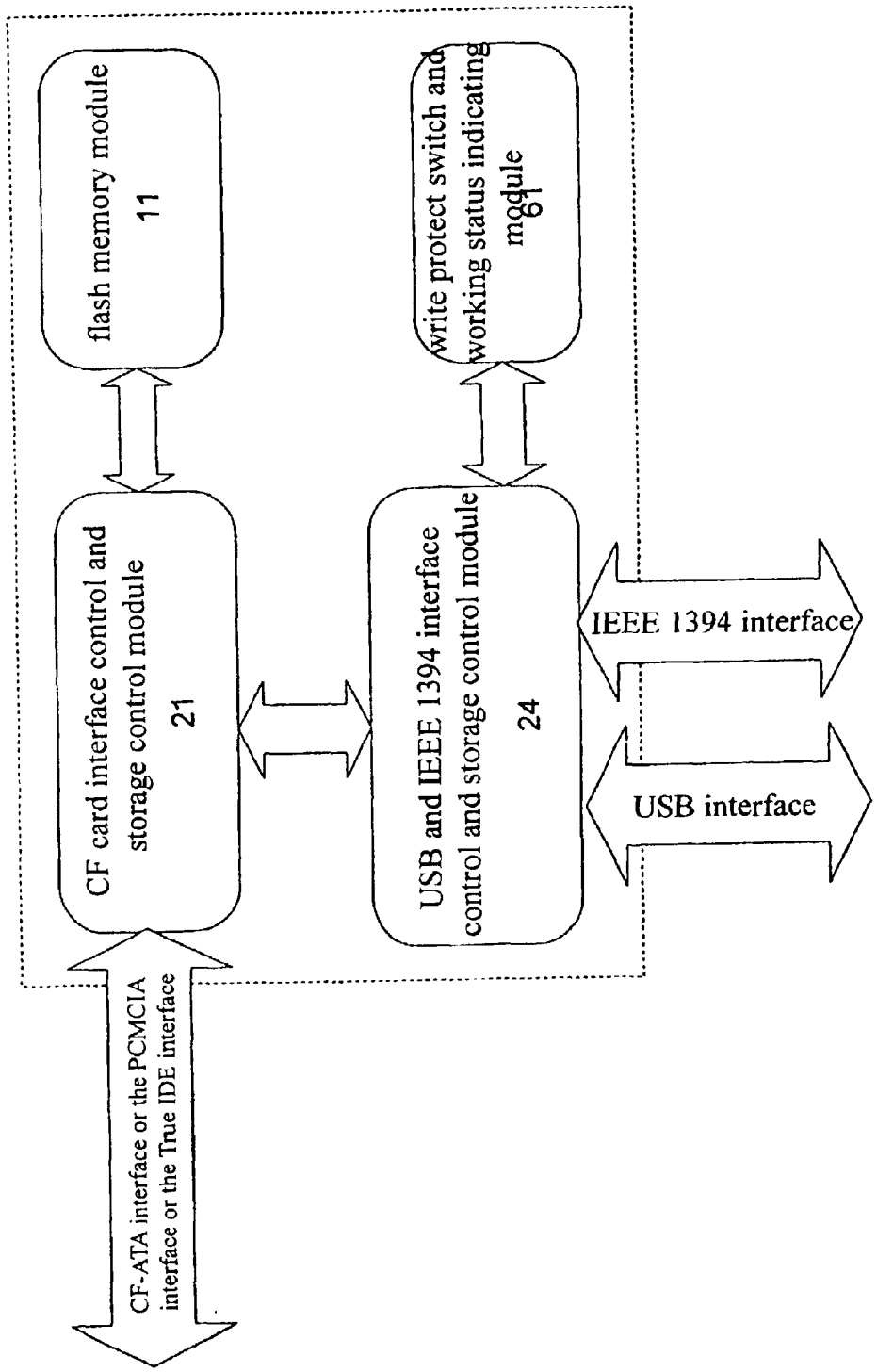
FIG. 4 is a block diagram of the embodiment III according to the present invention using the CF interface, the USB interface, and the IEEE1394 interface.

In the third embodiment of the present invention as shown in FIG. 4, the present device owns the CF interface, USB interface and IEEE 1394 interface, comprises a flash memory module 11, a CF interface control and storage control module 21, a USB and IEEE 1394 interface control and storage control module 24, a CF-ATA interface or PCMCIA interface or True IDE interface, a USB interface, an IEEE 1394 interface, and a write-protect switch and working status indicating module 61. The CF interface control and storage control module 21 and the USB and IEEE 1394 interface control and storage control module 23 implement the functions of the controller module 20 and the interface module 40 as shown in FIG. 1. The CF interface control and storage control module 21 is connected respectively to the flash memory module 11, and the USB and IEEE 1394 interface control and storage control module 24, which are connected with the write-protect switch and the working status indicating module 61. When in use, the device according to the present invention is connected through the CF-ATA interface or the PCMCIA interface or the True IDE interface to the data processing system having the corresponding interface, or is connected through the USB and IEEE 1394 interface to the host system. All the above connections support the bilateral flow of signals and data.

In the present embodiment, the flash memory module 11 includes one or more flash memory chip, connected in accordance with the present addressing method, and the module can store the drivers of the present invention and other types of data files. The USB interface and the IEEE 1394 interface can be the standard such as the standard Mini USB interface and the standard Mini IEEE 1394 interface, or can be the non-standard USB interface and IEEE 1394 interface. That is, the IEEE 1394 interface in the present embodiment conforms to the IEEE 1394 standard in both its electric signals and physical structure and size, or only the electric signals conform to the IEEE 1394 standard while its physical structure and size are of non IEEE 1394 standard. Furthermore, the USB interface conforms to the USB standard in both its electric signals and physical structure and size, or only the electric signals conform to the USB standard while its physical structure and size are of non USB standard.

The USB interface and the IEEE 1394 interface control and storage control module 24 completes its connection with the host system, interprets, converts, controls and transmits the USB interface and the IEEE1394 interface protocols. It completes the initialization and control of the USB or IEEE 1394 interface, receives commands and data from the host computer, interprets and executes the commands, stores the data into the flash memory module 11 or reads data from it through the CF interface control and storage control module 21, and returns the results of the execution through the USB or IEEE 1394 interface to the host computer.

The CF interface control and storage control sub module 21 can complete its connection with the data processing system, and interprets, converts, controls and transmits the CF-ATA interface or PCMCIA interface or True IDE interface protocol; It completes the initialization and control of the CF-ATA interface or PCMCIA interface or True IDE interface, receives data and commands from the data processing system, interprets and executes the commands, stores the data to the flash memory module 11 or reads data from it, returns the results of the execution to the data processing system, receives the control commands and data of the USB interface and the IEEE 1394 interface control and storage control sub module 24, and saves the data to be stored to the flash memory module 11 or reads data from it, returns the results of the execution to the USB interface and the IEEE 1394 interface control and storage control sub module 24.

Figure 5:
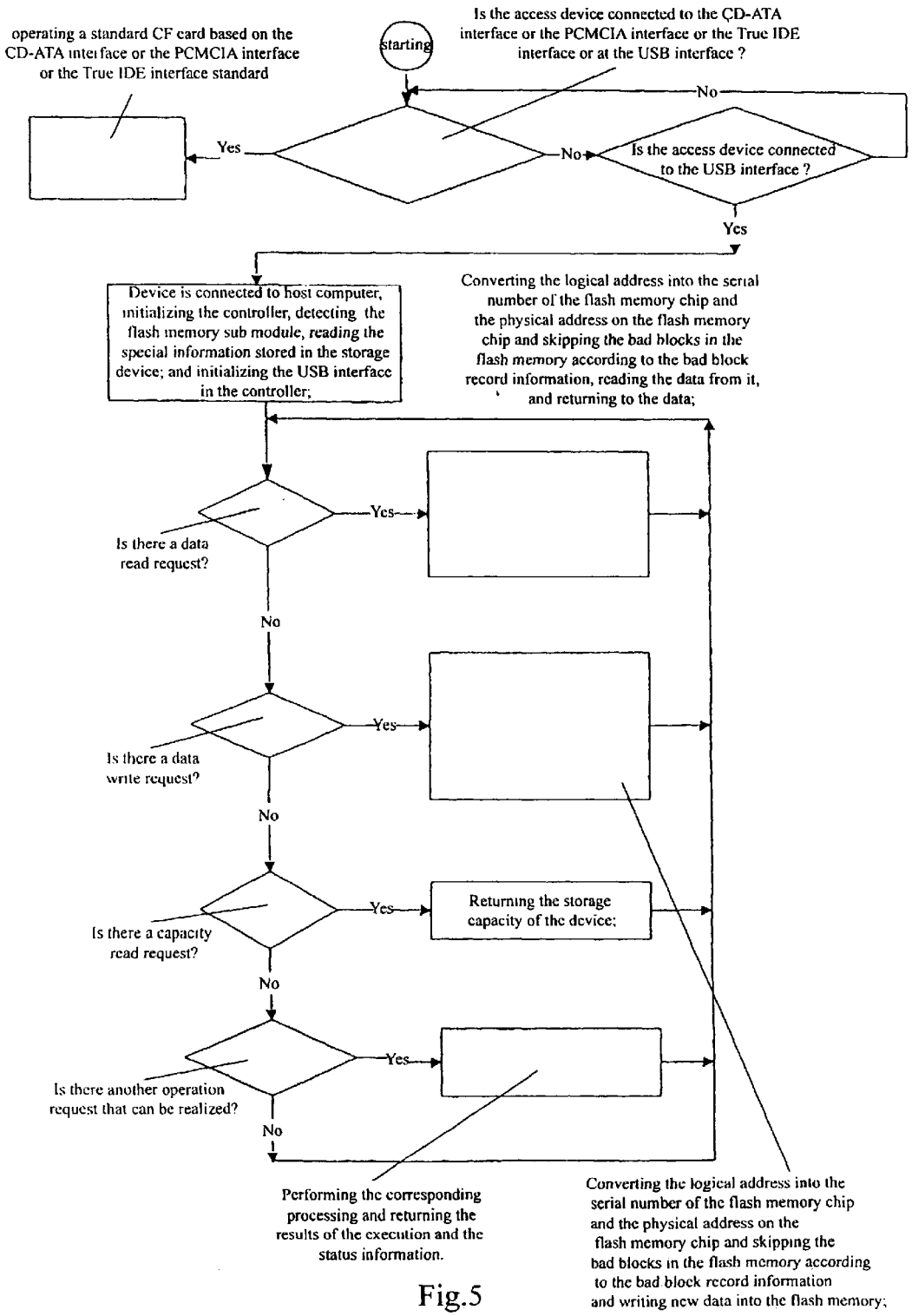
FIG. 5 is an internal workflow chart of the present invention using the CF interface and the USB interface.

FIG. 5 shows the internal operating flow of the first embodiment of the present invention, comprising of the following steps:

Step One: It decides whether the access device is on the CF-ATA interface or the PCMCIA interface or the True IDE interface or at the USB interface;

Step Two: If there is an access device on the CF-ATA interface or the PCMCIA interface or the True IDE interface, its internal operation then runs like that of a standard CF card;

Step Three: If there is an access device on the USB interface, it gets power from the USB interface; it initializes the USB interface, the USB interface control and storage control sub module; and it detects the flash memory sub module and reads the special information about the storage device of the present invention;

Step Four: It judges whether there is a data read request. If so, it then converts the logical address into the serial number of the flash memory chip and the physical address on the flash memory chip and skips the bad blocks in the flash memory according to the bad block record information and reads the data from it before returning the data at last and returning to the second step; if not so, it then decides whether there is a data write request;

Step Five: If there is a data write request, it then converts the logical address into the serial number of the flash memory chip and the physical address on the flash memory chip and skips the bad blocks in the flash memory according to the bad block record information and writes data into the flash memory before returning to the fourth step; if not so, it then judges whether there is a capacity read request;

Step Six: If there is a capacity read request, it then returns the capacity of the device and returns to the second step, and if not so, it then decides whether this is another operation request;

Step Seven: If there is another operation request that can be realized, it then performs the corresponding processing and returns the results of the execution and the status information and returns to the second step, otherwise it will return to the second step directly.

Once the host computer is powered off or the device is removed from the host system, the device will cease working and the information that has been stored will be preserved.

Figure 6:
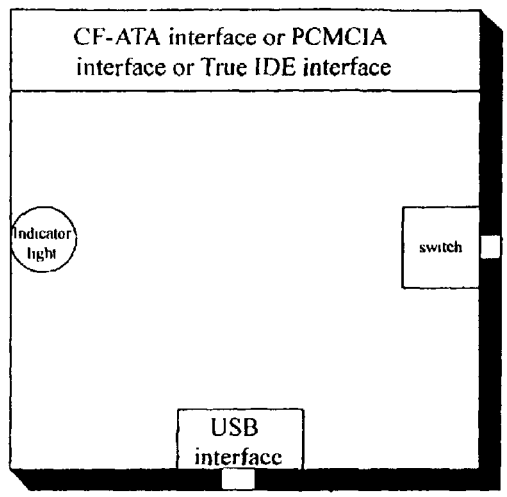
FIG. 6 shows the different appearances of the embodiments according to the present invention.
Figure 6:
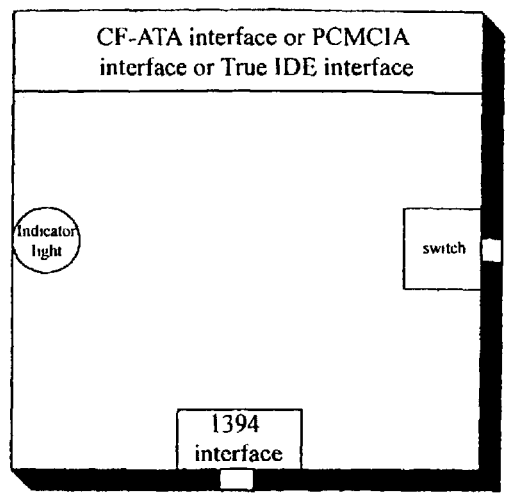
Figure 6:
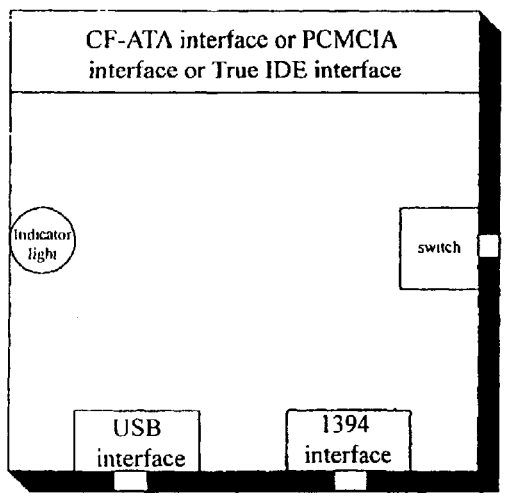
Figure 6:
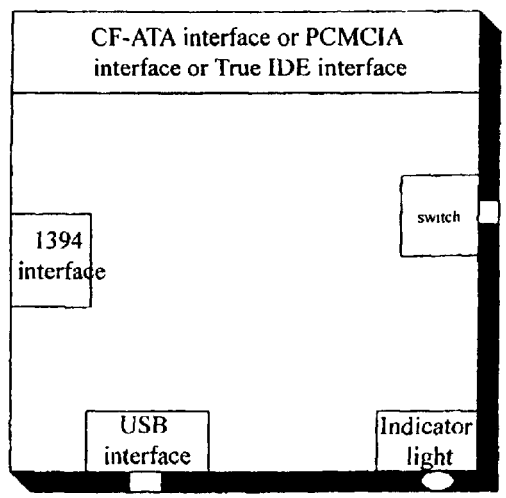

The shapes of the embodiments of the present invention are shown in FIG. 6. FIGS. 6-1, 6-2, 6-3 and 6-4 all have the CF-ATA interface or the PCMCIA interface or the True IDE interface, an indicator light and a switch. The interfaces, the indicator light, and the switch are located on the four sides of the mini flash memory, and this distribution is subject to different arrangements not only limited to the four types of distribution illustrated in FIG. 6.

Figure 7A:
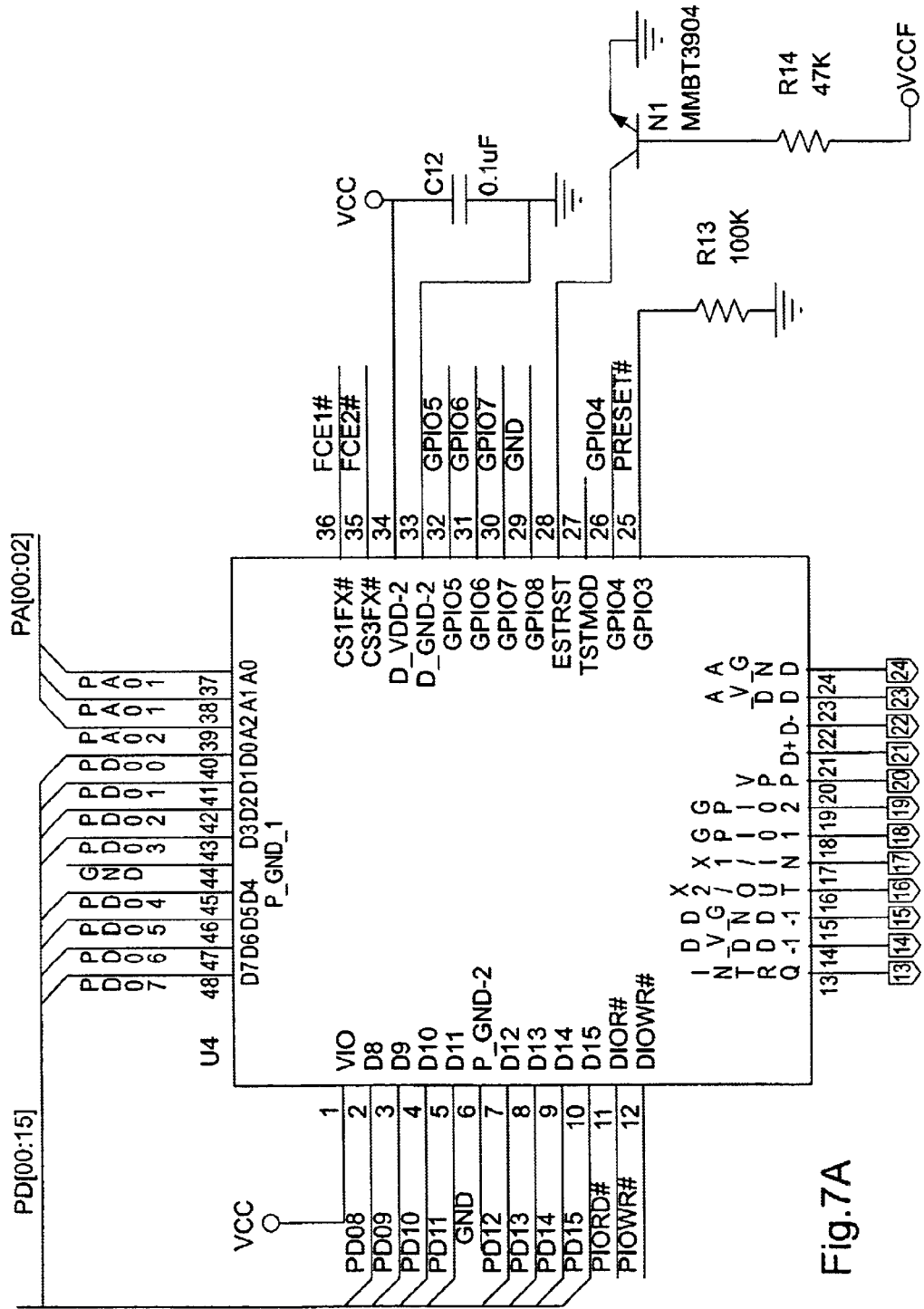
FIG. 7 shows the circuitry of the USB interface control and the storage control module 22 in embodiment I of the present invention.
Figure 7B:
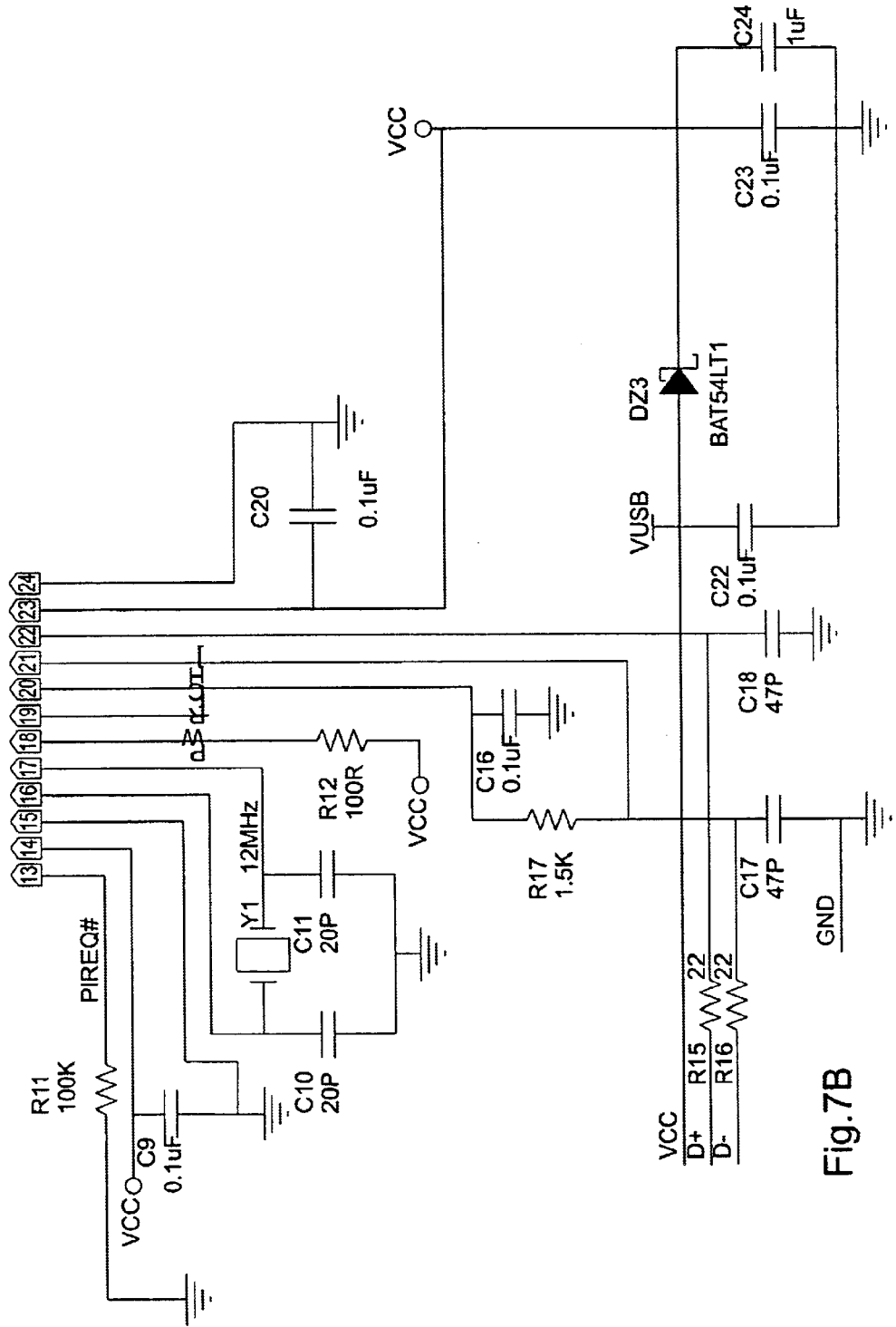
Figure 7C:
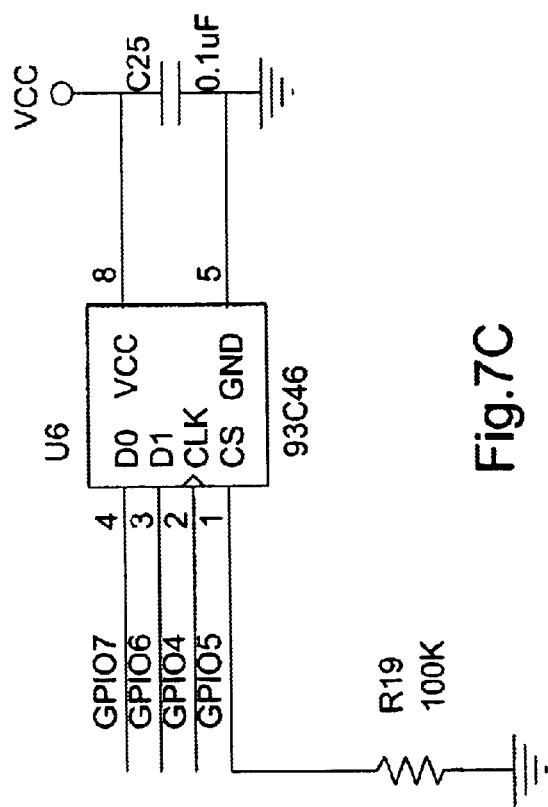

FIG. 7 illustrates the circuitry of the USB interface control and storage control module 22 of the first embodiment of the present invention as shown in FIG. 2. It adopts the 48-pin NT 2004 AGS chip U4, whose first pin is connected with the power supply VCC. Pins 2–5, 7–10, 40–48 of the chip U4 are all connected respectively in accordance with the PD serial number shown in the figures to the chip U3 of the CF interface control and storage control module 21 and the pins with the same PD serial numbers in the CFCARD1 in the CF-ATA interface or the PCMCIA interface or the True IDE interface. Pins 6, 15, 24, and 33 of the chip U4 are directly grounded. Pins 11, 12, and 13 are connected respectively to pins 34, 35, and 37 of the CFCARD1 in the CF-ATA interface or the PCMCIA interface or the True IDE interface. Pin 14 of the chip U4 is connected to the power supply VCC and is grounded via the 0.1-microfarad capacitor. Pins 16 and 17 of the chip are connected by a 12 MHz crystal vibrotron Y1. Pin 18 of the chip is connected to the power supply VCC via the 100K resistor. Pin 28 is connected to the collector of the triode N1, whose model number is MMBT3904. The emitter of the triode N1 is ground and its base is connected to the power supply VCCF via the resistor R14 having a resistance value 47KΩ. Pins 26, 30, 31 and 32 of the chip are connected to the 93C46 storage chip U6 in accordance with the GPIO serial number and serve as special information storage.

Figure 8:
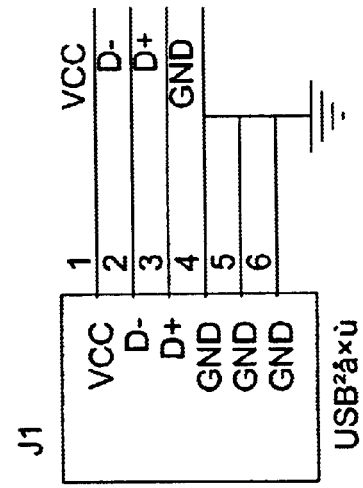
FIG. 8 shows the circuitry of the USB interface in the first embodiment according to the invention.

FIG. 8 shows the circuitry of the USB interface of the first embodiment as shown in FIG. 2. The interface chip J1 is connected to the bus power supply VCC through pin 1, pins 2 and 3 serve as the pins 21 and 22 of the data cable connection chip U4 and pins 4, 5 and 6 are grounded.

Figure 9A:
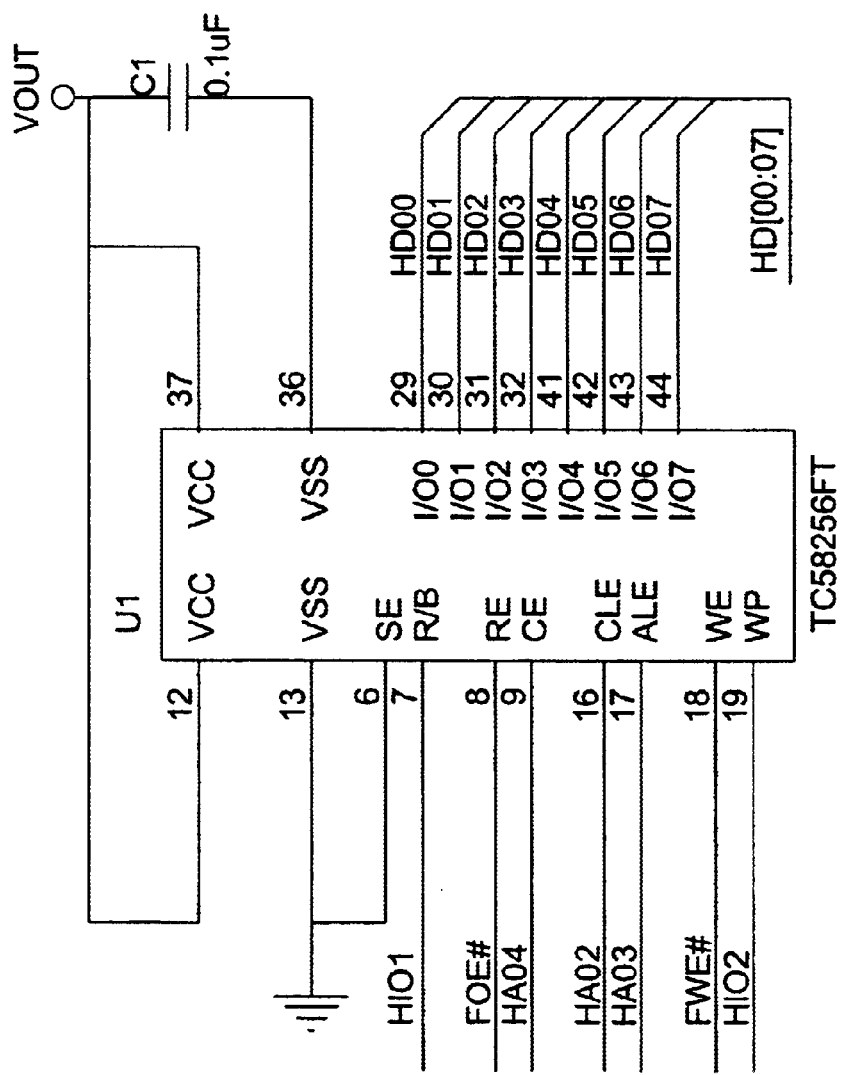
FIG. 9 shows the circuitry of the flash memory model 11 in the first embodiment according to the invention.
Figure 11A:
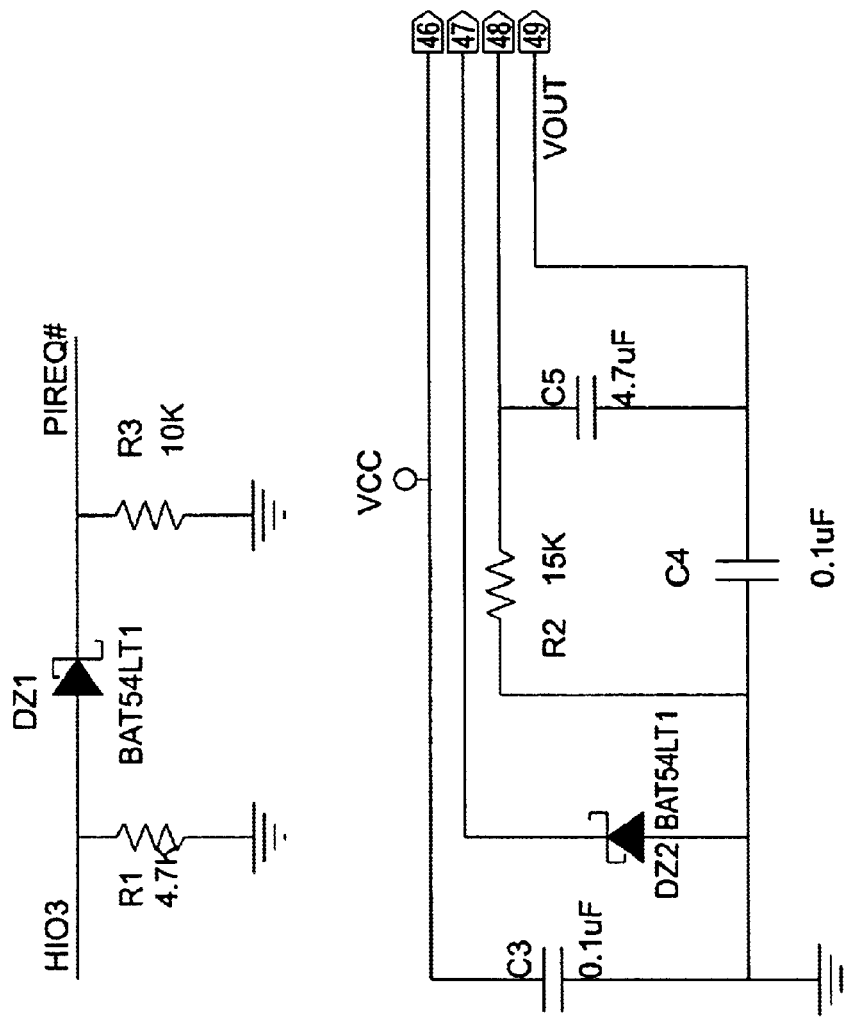
FIG. 11 shows the circuitry of the CF card interface control and storage control module 21 in the first embodiment according to the invention.
Figure 11B:
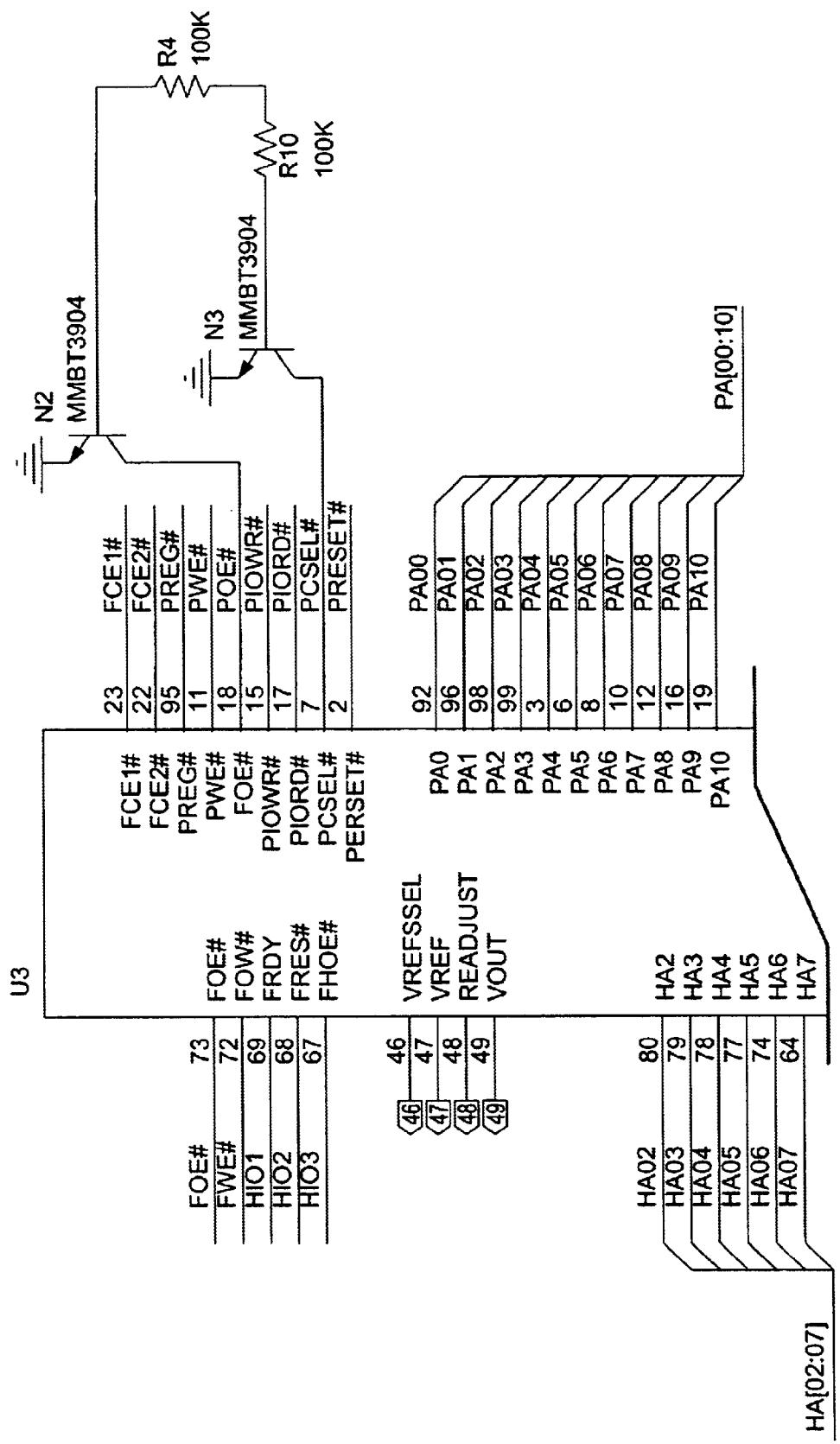
Figure 11C:
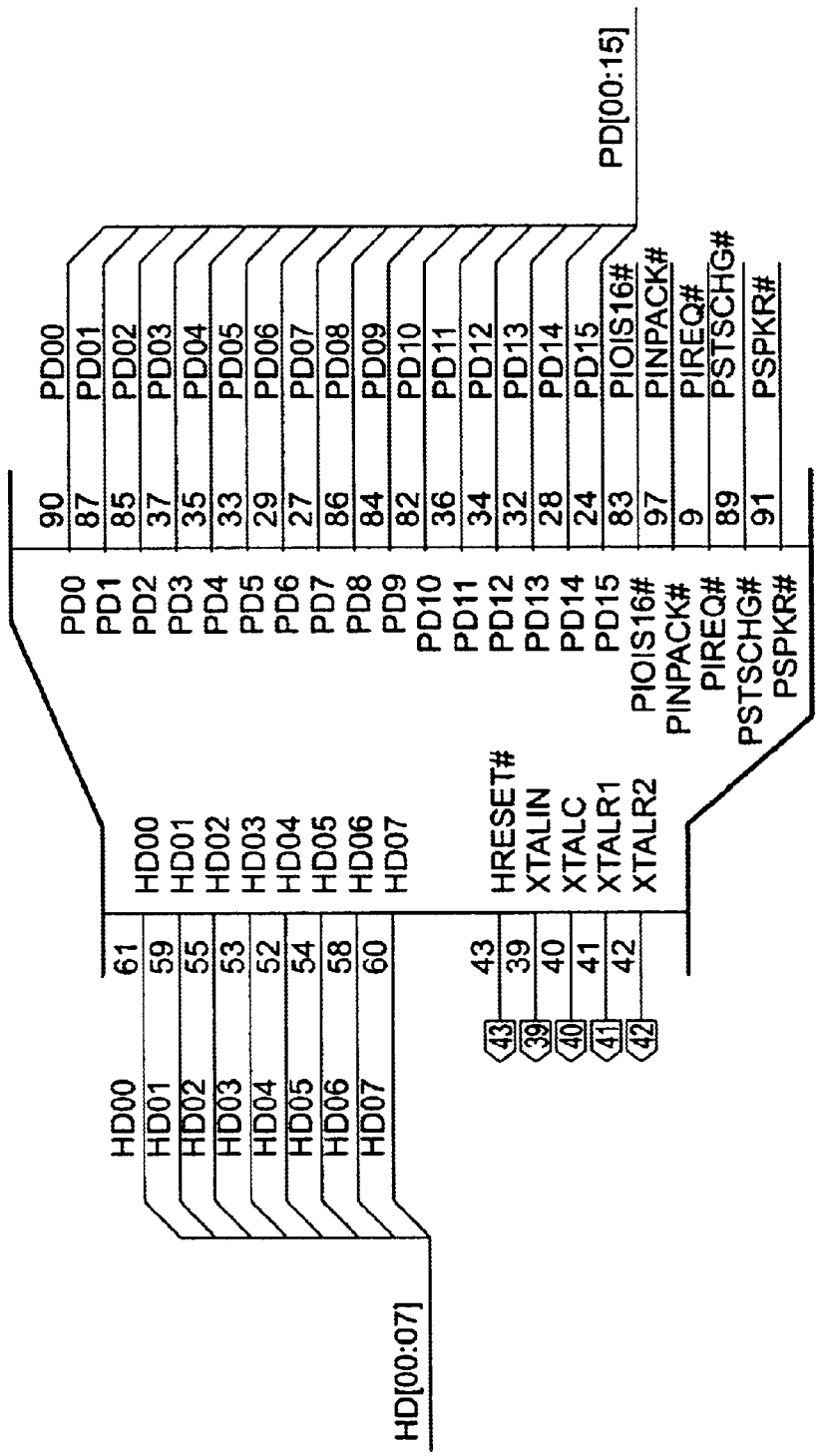
Figure 11D:
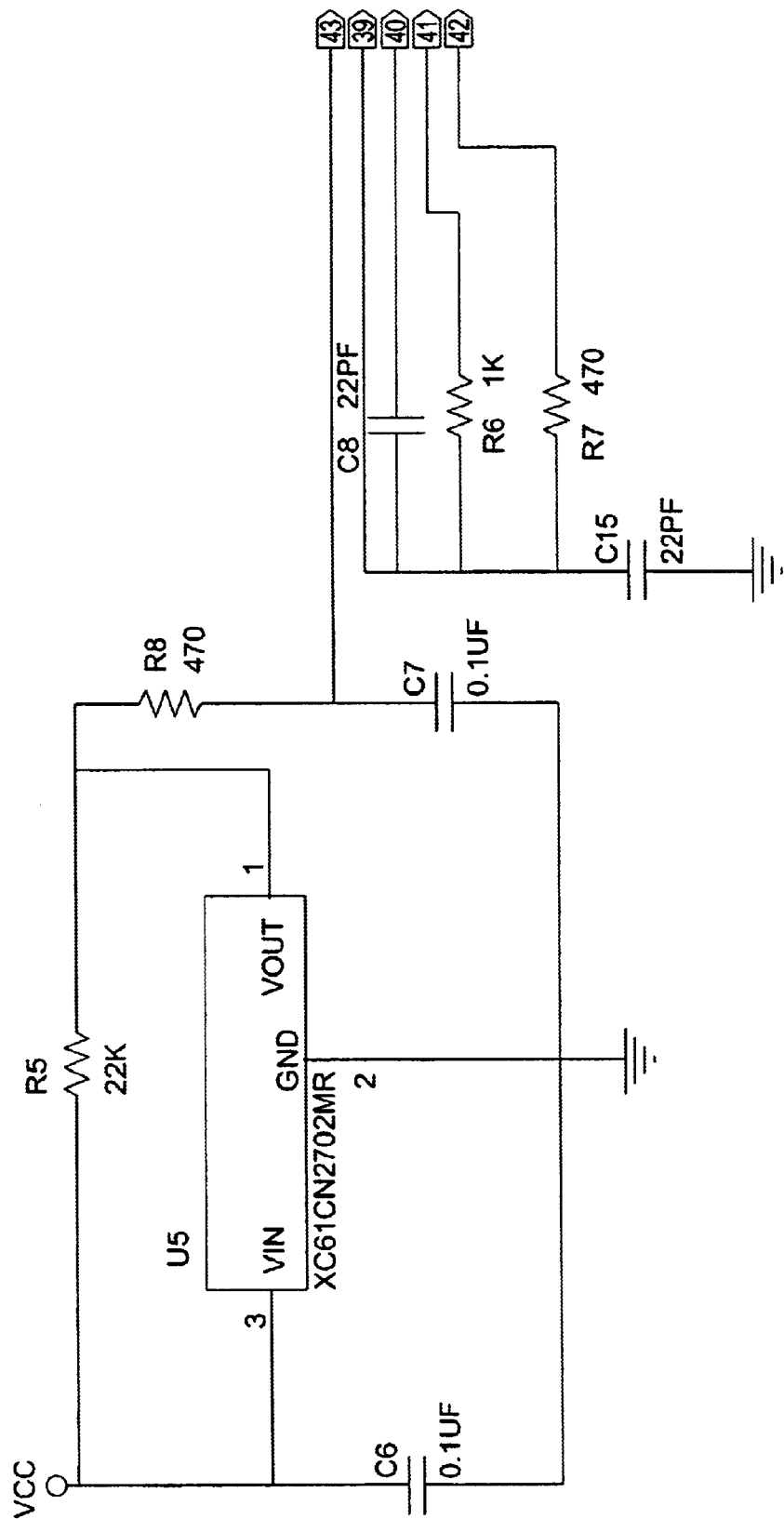
Figure 11E:
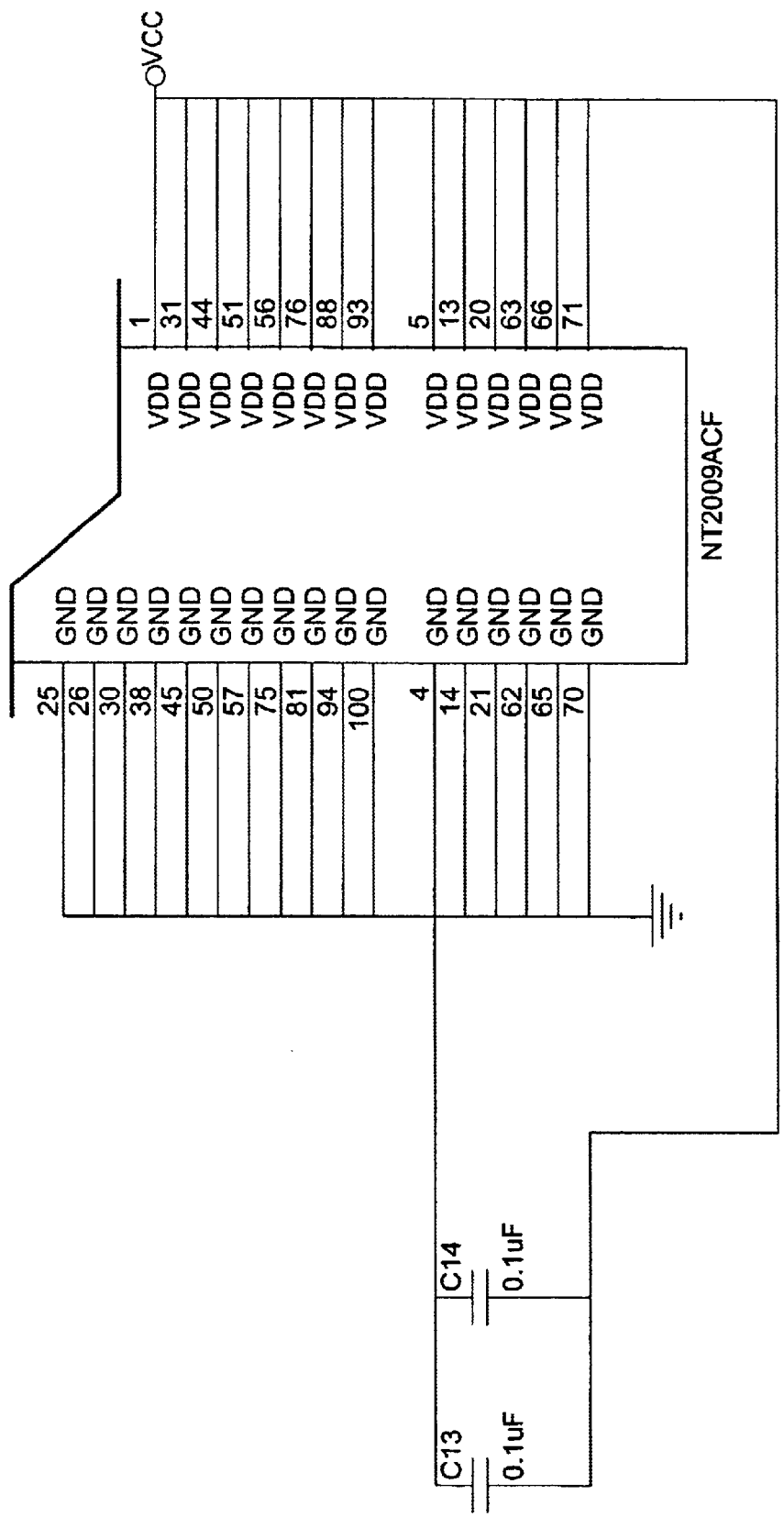

FIG. 9 shows the circuitry of the flash memory module 11 of the first embodiment as shown in FIG. 2. The flash memory chips U1 and U2 adopt TC58256FT, whose I/O pins are connected in accordance with the HD serial number to the pins with the same HD serial numbers in the chip U3 in the CF interface control and storage control module 21 and the other pins are also connected to the corresponding pins of the chip U3 in the CF interface control and storage control module 21.

FIG. 10 shows the circuitry of the write-protect switch and status indicating module 61 in the first embodiment as shown in FIG. 2. The write protect function has not been included in the circuitry drawing. The indicator adopts a LED connected to pin 31 of the chip U4 and grounded via the 470 Ω resistor R18.

FIG. 11 shows the circuitry of the CF interface control and storage control module 21 in the first embodiment as shown in FIG. 2. The chip U3 of the module adopts NT2009ACF, connected in accordance with the PD serial number to the pins 2–5, 7–10, and 40–48 of the chip U4 in the USB interface control and storage control module 22. The chip is connected to the corresponding pins of the flash memories U1 and U2 in the flash memory module 11 in accordance with the HD serial numbers.

Figure 12:
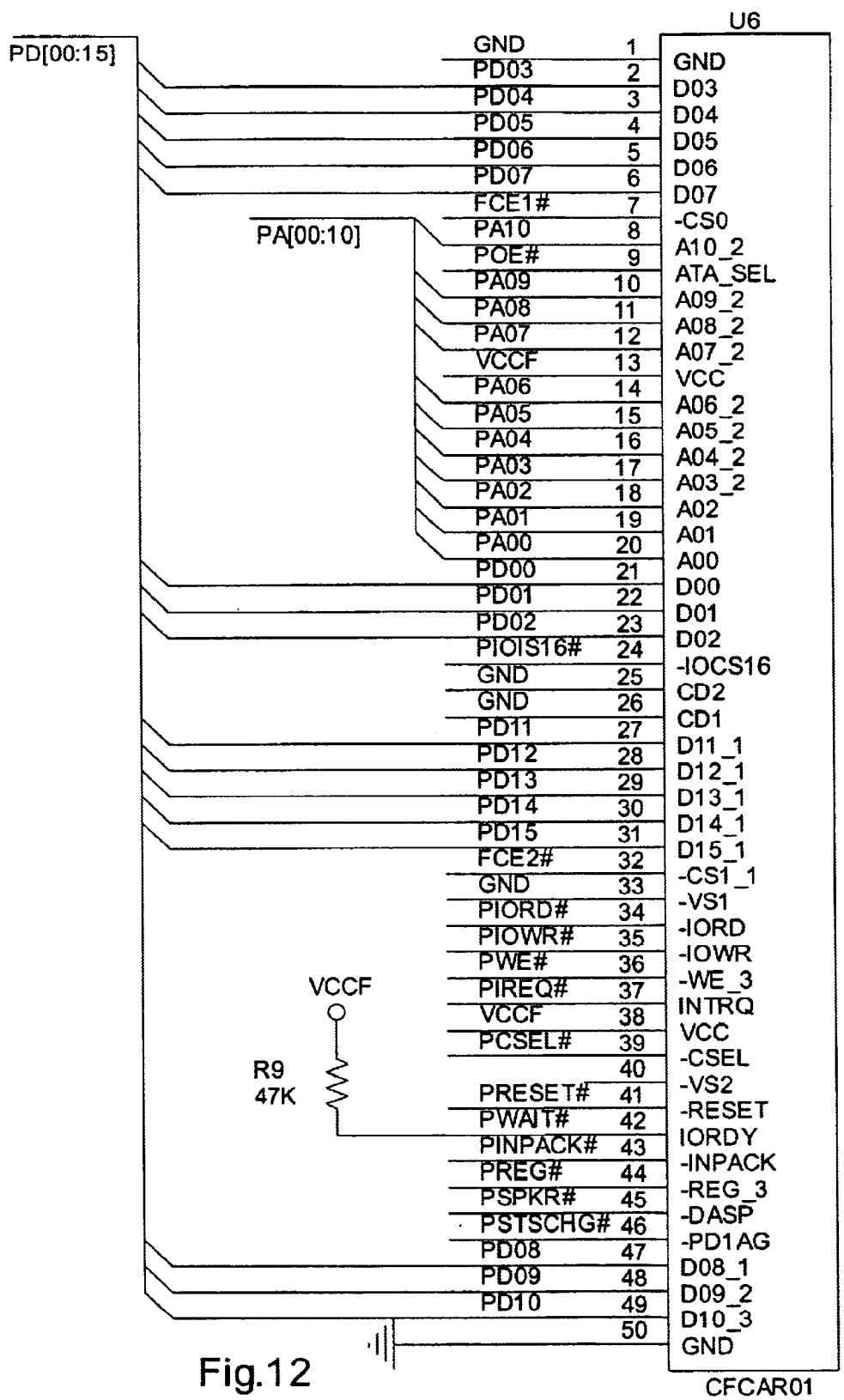
FIG. 12 shows the circuitry of the CF interface in the first embodiment according to the invention.

FIG. 12 shows the circuitry of the CF-ATA interface or the PCMCIA interface or the True IDE interface in the first embodiment as shown in FIG. 2. It adopts the interface chip CFCARD1, which is connected in accordance with the PD serial number to the chip U4 of the USB interface control and storage control module 22 and the chip U3 of the CF interface control and storage control module 21.

The CF interface is compatible with the CF-ATA interface, the PCMCIA interface and the True IDE interface.

Figure 13:
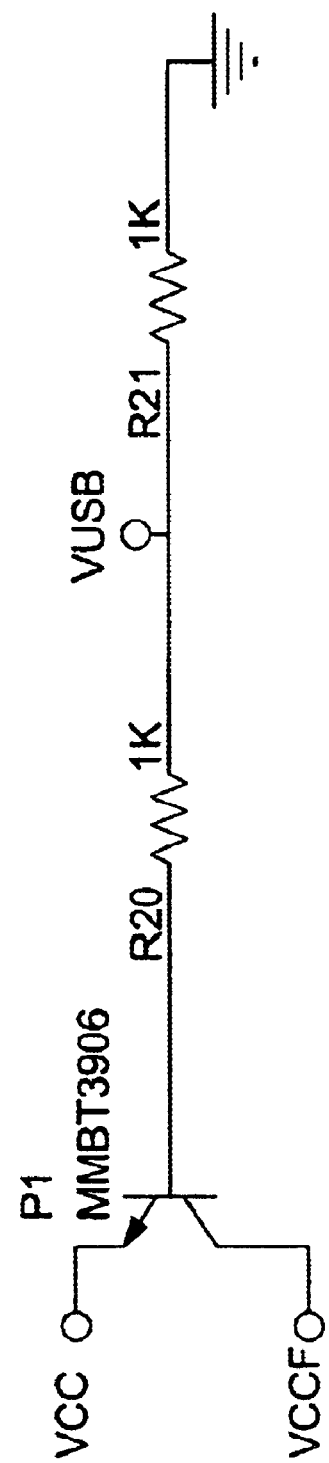
FIG. 13 shows the circuitry of the power supply module 71 in the first embodiment according to the invention.

FIG. 13 shows the circuitry of the power supply module 71 of the embodiment as shown in FIG. 2. The emitter of the MMBT3906 chip P1 is connected into the power supply VCCF introduced from the host computer by the CF-ATA interface of the PCMCIA interface or the True IDE interface. The collector of P1 is connected to the power supply VCC introduce by the USB interface and the base electrode is grounded via the resistors R20 and R21 respectively having a resistance value 1KΩ and provides power VUSB between the resistors R20 and R21.

What is claimed is:

1. A semiconductor storage method supporting multi-interface, comprising steps:
   (a) setting up a semiconductor storage device in which is installed a semiconductor storage medium module (10), a controller module (20) to control said semiconductor storage device, and an interface module (40) which supports at least two interfaces of different standards, wherein said interfaces of different standards include serial or parallel or wireless communication interfaces; physically, said modules can exist independently or they can be combined into one or two modules;
   (b) connecting said storage device, through said interfaces of different standards, to at least one data processing system which has the corresponding standard interface;
   (c) establishing information exchange channel between said storage device and said data processing system based upon said serial or parallel or wireless communication interfaces;
   (d) said storage device exchanges data through said exchange channel with said data processing system and stores data from said data processing system into said semiconductor storage medium module (10); said data processing system can retrieve required data from said semiconductor storage device.

2. A semiconductor storage method according to claim 1, wherein said controller module (20) of said semiconductor storage device can be physically a single module or it can consist of plurality of sub-modules; said controller module (20) controls operation of different interfaces through said interface module (40) to coordinate the operation of said different interfaces and avoid conflicts.

3. A semiconductor storage method according to claim 1, wherein said interfaces of different standards are physically located at different place of said semiconductor storage device.

4. A semiconductor storage method according to claim 1, wherein said serial or parallel or wireless communication interface can be CF (Compact Flash), USB (Universal Serial Bus), IEEE 1394, PCMCIA, True IDE, Bluetooth or wireless LAN interfaces.

5. A semiconductor storage method according to claim 1, wherein semiconductor storage medium used by said semiconductor storage medium module (10) can be Flash Memory, DRAM, EEPROM, SRAM, FRAM, or MRAM.

6. A semiconductor storage method according to claim 1, wherein working power supply of said semiconductor storage device is provided through said serial or parallel interfaces; in the case that wireless communication interface is used, said semiconductor storage device is self-powered or is externally powered.

7. A semiconductor storage method according to claim 1, wherein further comprising:
   indicating the working status of said semiconductor storage device via at least one indicator in working status indicating module (60).

8. A semiconductor storage method according to claim 7, wherein said indicator can be LED, LCD, vibrator or sound indicator.

9. A semiconductor storage method according to claim 1, wherein further comprising:
   write-protect method for preventing data from being written into said semiconductor storage medium module (10).

10. A semiconductor storage method according to claim 1, wherein further comprising:

when said semiconductor storage device is disconnected from said data processing system, the stored data is retained in said semiconductor storage device.

11. A semiconductor storage method according to claim 1, wherein further comprising:

setting up a power supply module (70) in said semiconductor storage device, whose function includes but not limited to selecting power supply source for said semiconductor storage device.

12. A semiconductor storage device supporting multi-interface, comprising: a semiconductor storage medium module (10) for storing data, a controller module (20), and an interface module (40) which supports at least two interfaces of different standards, wherein said interfaces of different standards include serial or parallel or wireless communication interfaces; said controller module (20) is connected with said semiconductor storage medium module (10) and said interface module (40), thereby coordinating the operation of the different modules; physically, said modules can exist independently or they can be combined into one or two modules.

13. A semiconductor storage device according to claim 12, wherein said controller module (20) of said semiconductor storage device can be physically a single module or it can consist of plurality of sub-modules; said controller module (20) controls operation of different interfaces through said interface module (40) to coordinate the operation of said different interfaces and avoid conflicts.

14. A semiconductor storage device according to claim 12, wherein said interfaces of different standards are physically located at different place of said semiconductor storage device.

15. semiconductor storage device according to claim 12, wherein said serial or parallel or wireless communication interface can be CF (Compact Flash), USB (Universal Serial Bus), IEEE 1394, PCMCIA, True IDE, Bluetooth or wireless LAN interfaces.

16. A semiconductor storage device according to claim 12, wherein said at least two interfaces of different standards can be CF interface and USB interface, or CF interface and IEEE 1394 interface.

17. A semiconductor storage device according to claim 12, wherein semiconductor storage medium of said semiconductor storage medium module (10) can be Flash Memory, DRAM, EEPROM, SRAM, SDRAM, FRAM, or MRAM.

18. A semiconductor storage device according to claim 12, wherein working power supply of said semiconductor storage device is provided through said serial or parallel interfaces; in the case that wireless communication interface is used, said semiconductor storage device is self-powered or is externally powered.

19. A semiconductor storage device according to claim 12, wherein further comprising a working status indicating module (60) to indicate the working status of said semiconductor storage device via at least one indicator in said working status indicating module (60).

20. A semiconductor storage device according to claim 19, wherein said indicator can be LED, LCD, vibrator or sound indicator.

21. A semiconductor storage device according to claim 12, wherein further comprising at least one write-protect switch for preventing data from being written into said storage medium module (10).

22. A semiconductor storage device according to claim 12, wherein a power supply module (70) is set up in said semiconductor storage device, whose function includes but not limited to selecting power supply source for said semiconductor storage device.

* * * * *

(12) INTER PARTES REEXAMINATION CERTIFICATE (0449th)
United States Patent
Deng et al.

(10) Number: US 6,795,327 C1
(45) Certificate Issued: Sep. 11, 2012

(54) SEMICONDUCTOR STORAGE METHOD AND DEVICE SUPPORTING MULTI-INTERFACE

(75) Inventors: Guoshun Deng, Shenzhen (CN); Xiaohua Cheng, Beijing (CN); Feng Xiang, Shenzhen (CN)

(73) Assignee: NETAC Technology Co., Ltd., Shenzhen (CN)

Reexamination Request:
No. 95/001,209, Jul. 16, 2009

Reexamination Certificate for:
Patent No.: 6,795,327
Issued: Sep. 21, 2004
Appl. No.: 10/261,001
Filed: Sep. 30, 2002

(51) Int. Cl.
*G11C 5/06* (2006.01)

(52) U.S. Cl. ................. 365/63; 365/51; 365/230.03
(58) Field of Classification Search ................. None
See application file for complete search history.

(56) References Cited

To view the complete listing of prior art documents cited during the proceeding for Reexamination Control Number 95/001,209, please refer to the USPTO's public Patent Application Information Retrieval (PAIR) system under the Display References tab.

*Primary Examiner* — Tuan H. Nguyen

(57) ABSTRACT

A semiconductor storage method and device supporting multi-interface includes the acts of setting up a semiconductor storage device in which is installed a semiconductor storage medium module, a controller module, and an interface module which supports at least two interfaces of different standards, wherein the interfaces include serial or parallel or wireless communication interfaces; connecting the storage device, through the interfaces of different standards, to at least one data processing system which has the corresponding standard interface; establishing information exchange channel between the storage device and the data processing system based upon the serial or parallel or wireless communication interfaces; the storage device exchanges data with the data processing system through the information exchange channel. The method is to provide convenient mobile storage devices for data processing systems that have different interfaces, and to make data and files exchange easily and conveniently among different data processing systems.

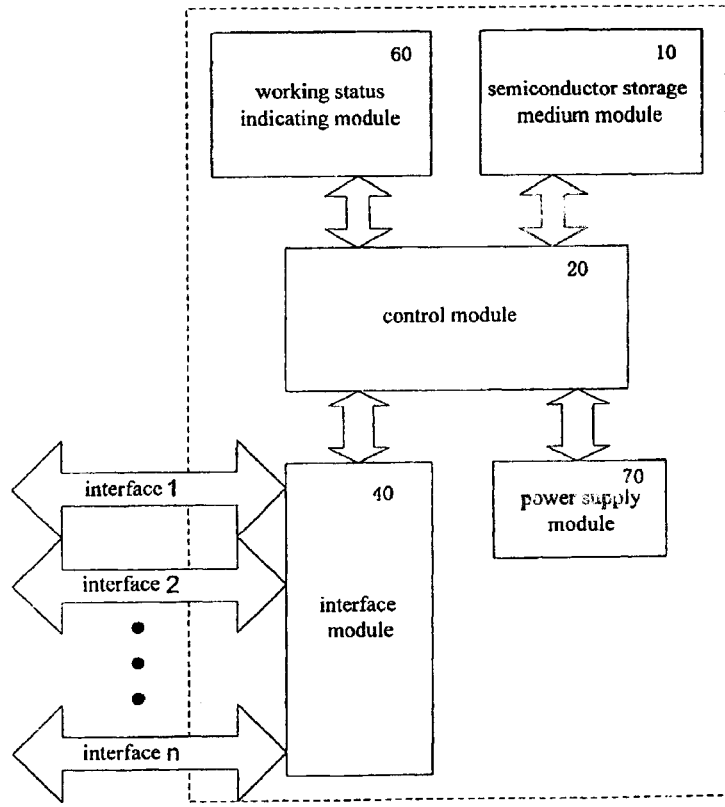

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1-22 are cancelled.

* * * * *